(12) United States Patent
Varier et al.

(10) Patent No.: US 12,328,102 B2
(45) Date of Patent: Jun. 10, 2025

(54) METHODS AND APPARATUS TO IMPROVE PERFORMANCE OF AMPLIFIERS

(71) Applicant: TEXAS INSTRUMENTS INCORPORATED, Dallas, TX (US)

(72) Inventors: Vivek Varier, Tucson, AZ (US); Srinivas Pulijala, Tucson, AZ (US); Vadim Ivanov, Tucson, AZ (US); Jerry Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/732,385

(22) Filed: Apr. 28, 2022

(65) Prior Publication Data
US 2023/0353100 A1 Nov. 2, 2023

(51) Int. Cl.
*H03F 3/16* (2006.01)
*H03F 1/30* (2006.01)

(52) U.S. Cl.
CPC ............. *H03F 1/301* (2013.01); *H03F 3/16* (2013.01); *H03F 2200/447* (2013.01)

(58) Field of Classification Search
CPC ...... H03F 1/301; H03F 3/16; H03F 2200/447; H03F 2200/75; H03F 2203/45362; H03F 3/3028; H03F 3/45192
USPC .......................................... 330/252–261, 267
See application file for complete search history.

(56) References Cited

U.S. PATENT DOCUMENTS

| | | | | |
|---|---|---|---|---|
| 7,777,574 | B1 * | 8/2010 | Nielsen | H03F 1/305 330/296 |
| 7,994,858 | B2 * | 8/2011 | Standley | H03F 3/45192 330/253 |
| 2020/0119698 | A1 | 4/2020 | Purdila et al. | |
| 2023/0353096 | A1 | 11/2023 | Venkiteswaran et al. | |

FOREIGN PATENT DOCUMENTS

CN    116979910 A    10/2023

OTHER PUBLICATIONS

Machine translation for CN116979910A.

* cited by examiner

*Primary Examiner* — Hieu P Nguyen
(74) *Attorney, Agent, or Firm* — Mandy Barsilai Fernandez; Frank D. Cimino (57) ABSTRACT

An example apparatus includes: An amplifier comprising folded cascode circuitry having an input and an output, an input pair coupled to the input, clamp circuitry including: a first transistor having a first drain, a first source, and a first gate, the first source coupled to the output, a second transistor having a second drain, a second source, and a second gate, the second drain coupled to the first drain and the second gate coupled to the first drain and second drain, a third transistor having a third drain, a third source, and a third gate, the third source coupled to the output, and a fourth transistor having a fourth drain, a fourth source, and a fourth gate, the fourth drain coupled to the third drain and the fourth gate coupled to the third drain and the fourth drain.

19 Claims, 5 Drawing Sheets

METHODS AND APPARATUS TO IMPROVE PERFORMANCE OF AMPLIFIERS

TECHNICAL FIELD

This description relates generally to amplifiers, and more particularly to methods and apparatus to improve long term performance of amplifiers.

BACKGROUND

High precision amplifiers may be designed similar to an operational amplifier but with a higher performance specification. The gain of high precision amplifiers is required to remain consistent even when under zero load current conditions. High precision amplifiers include a minimum gain requirement resulting in frequency stability with capacitive loads and low distortion of sinusoidal signals. When the supply voltage is high (e.g., voltage supply VDD), variations in the performance (e.g., negative performance and desired performance) of the high precision output stage may occur.

Negative Bias Temperature Instability (NBTI) and Positive Bias Temperature Instability (PBTI) are phenomena observed in some metal-oxide-semiconductor field effect transistors (MOSFETs) that causes performance instability in the affected MOSFETs. NBTI and PBTI may occur due to aging of the affected devices, elevated device temperature and/or the gate biasing of the affected devices. P-channel MOSFETs (PMOS or pMOSFET) are more susceptible to NBTI than N-channel MOSFETs (NMOS or nMOSFET). NBTI results in the threshold voltage, required to turn "on" (e.g., cause to conduct current) a transistor, to vary as an interface charge builds on a subsurface of a gate of a transistor over time. The NBTI and PBTI effects on high precision amplifiers may result in increasing variation in the operation of the amplifier.

SUMMARY

For methods and apparatus to improve long term performance of amplifiers, an example amplifier includes folded cascode circuitry having an input and an output. The amplifier further includes clamp circuitry. The apparatus includes an input pair coupled to the input. The apparatus includes clamp circuitry including a first transistor having a first drain, a first source, and a first gate, the first source coupled to the output. The clamp circuitry includes a second transistor having a second drain, a second source, and a second gate, the second drain coupled to the first drain and the second gate coupled to the first drain and second drain. The clamp circuitry includes a third transistor having a third drain, a third source, and a third gate, the third source coupled to the output. The clamp circuitry includes a fourth transistor having a fourth drain, a fourth source, and a fourth gate, the fourth drain coupled to the third drain and the fourth gate coupled to the third drain and the fourth drain.

BRIEF DESCRIPTION OF THE DRAWINGS

The same reference numbers or other reference designators are used in the drawings to designate the same or similar (functionally and/or structurally) features.

DETAILED DESCRIPTION

In high precision amplifiers, there may be an issue with ensuring precision and performance over an extended period of time (e.g., the lifetime of an amplifier). For example, it can be difficult to maintain the precision of an amplifier and ensure robust performance over the entire life of the amplifier. In large part, this can be due to degradation from the NBTI and/or PBTI phenomena. In some examples, "precision" includes an offset accuracy specification. The offset accuracy specification defines how the amplifier resolves a given signal output error. Ideally, the output of a differential amplifier should be at zero volts when both inputs are exactly at the same potential. However, in reality, the output goes to zero volts when there is a small voltage difference (e.g., voltage offset or "offset") between the inputs. This non-ideality originates from the inherent mismatch between the components inside the amplifier. The differential voltage that must be applied between the input terminals of the amplifier to bring its output voltage to zero volts is called the input offset voltage. In some examples, it is ideal to minimize the input offset voltage because inherent mismatches can degrade the precision of the amplifier circuitry over time.

In some examples, amplifiers are designed to compensate and/or correct inherent mismatches in the amplifier circuitry to minimize the output error. An amplifier may be calibrated using a trimming method for correcting any inherent mismatches as part of a foreground routine at final test or probe for most amplifier products. For example, during testing of the amplifier after it is manufactured (either as wafer-level testing, die-level testing and/or post packaging testing), the amplifier has, for example, a 100 μV offset instead of an ideal 0V offset, To correct for this inherent mismatch, the 100 μV are trimmed out at time zero (e.g., at the time before the amplifier is in use) and the amplifier is recalibrated.

Although this recalibration method improves the precision of the amplifier, it only improves the precision at time zero. Therefore, during the lifetime of the amplifier, the precision degrades again, due to different effects, such as NBTI and/or PBTI, For example, key amplifier circuitry components for matching may be subject to differential stress over various unregulated conditions, such as open loop comparator mode, shutdown operation with inputs skewed, short circuit condition at the output, overload condition, etc. The components that are supposed to match, under these conditions, become effected by NBTI and/or PBTI. A key component in the amplifier circuitry is the input differential pair. The input pair should be matched (e.g., the input pair of transistors should be as close to identical, in structure and performance, as possible) in order for the output error to be minimal. However, during the lifetime of the amplifier, the input differential pair may be impacted by NBTI and/or PBTI and there becomes mismatch at the input pair.

In addition to other external factors (e.g., ambient temperature), the NBTI shift arises from "negative" gate-tosource voltage stress, and the PBTI shift arises from a positive gate-to-body voltage stress. Depending on the biasing of the transistors, either of these effects could arise during the unregulated conditions. The unregulated conditions are usually a result of varied use cases (e.g., using the amplifier as a comparator, etc.). Additionally, at elevated temperatures, the degradation is worse. The NBTI and/or PBTI effects may modulate (e.g., cause to deviate from an ideal or an expected value) a threshold voltage for the MOS devices.

An important factor in terms of matching is that the threshold voltage of the input devices track together. The threshold voltage of a MOS device is the voltage at the gate required to fully invert the semiconductor. For example, an NMOS device is a transistor comprised of a P-type semiconductor body (e.g., forming the channel region), doped with two separated N-type regions (e.g., source and drain regions) and a gate structure insulatively formed over the channel region (e.g., comprised of insulating layer, such as an oxide or oxynitride, formed between the channel region and a conductive structure, such as a doped semiconductor structure, metal structure or a combination of both). The P-type semiconductor is the bulk and/or body of the MOSFET device and includes a number of "holes" (e.g., absences of electrons). When a positive voltage is applied to the gate relative to the semiconductor (e.g., the body, the bulk, etc.), a depletion region forms around the N-type regions, blocking any electrons in one of the N-type regions from moving to the other N-type region. As the voltage at the gate continues to become more positive relative to the semiconductor, and when there is a voltage applied across the two N-type regions (creating an electric field), a channel of electrons forms in the P-type semiconductor between the two N-type regions. The gate voltage at which the channel of electrons begins to form (e.g., when the semiconductor becomes inverted) is the threshold voltage.

PBTI arises when there is a high voltage stress applied at the gate with respect to the semiconductor, otherwise referred to as gate-to-body voltage stress and/or gate-to-bulk voltage stress. In some examples, this high voltage stress between the gate and semiconductor causes electrons to get trapped in the interface between the gate the semiconductor region and, thus, causes the threshold voltage to increase. For example, a higher gate voltage will be required to invert the semiconductor when the electrons are trapped in the interface and not free to form the channel between the two doped regions of the semiconductor.

When NBTI and/or PBTI modulates the threshold voltage of one of the input devices (e.g., a first MOSFET), the threshold voltage of the other input device (e.g., a second MOSFET) may no longer match the threshold voltage of the one input device. Threshold voltage mismatch in the input devices directly manifests in the form of an offset. This mismatch may start to degrade the performance of the amplifier (or other analog circuit that relies on a matching input pair of transistors). Currently, a method and/or implementation that tracks NBTI and/or PBTI effects over the lifetime of the amplifier does not exist and, thus, a method and/or implementation that corrects and/or reduces degradation of the amplifier over its lifetime has not been readily available.

In addition to the device issues discussed above, there may be secondary sources of differential stress in an amplifier (e.g., different sources than the input devices). For example, in a folded cascoded amplifier (e.g., a type of high precision amplifier), a fold device (e.g., current mirrors at the output signal chain of the amplifier) contributes to differential stress of the amplifier. Ideally, when the amplifier is operating, the gate-to-source voltages and gate-to-drain voltages of transistors of the current mirror are equal or approximately equal. However, when there is an unregulated condition at the input devices, a mismatch results between the current mirror transistors which negatively effects the precision of the amplifier. Additionally, when there is an unregulated condition, a similar mismatch in the bias voltages could result at the fold devices, which may additionally contribute to overall offset shifts.

Examples disclosed herein reduce and/or eliminate degradation of an amplifier during its lifetime by detecting a skewed amplifier condition (e.g., any one of the unregulated conditions) that may introduce NBTI and/or PBTI differential stress shifts, activating an auxiliary sacrificial pair of transistors for the input devices to steer the tail current from the main input pair to the auxiliary sacrificial pair, and clamping voltage nodes of the input devices and fold devices based on the type of differential stress (e.g., positive gate-to-source voltage only or negative gate-to-body voltage only) to prevent the degrading stress condition. Once the amplifier returns back to regulation (e.g., a condition where there is no differential stress), the main input device operation is restored.

Examples disclosed herein consider different schematic designs to ensure the auxiliary pair is only triggered when there is a skewed amplifier condition. For example, examples disclosed herein switch between the main input device and the auxiliary pair, and such switching is not triggered during standard amplifier large signal transient events (e.g., slewing, load transient response, etc.). In some examples, switching is not triggered during standard amplifier slewing operations because the delay in the skew triggering circuitry is ensured to be much slower than the native slew rate of the device.

Examples disclosed herein first detect that, during operation, there was a skew in the amplifier that could introduce NBTI and/or PBTI stress shifts. Second, examples disclosed herein activate the auxiliary input pair responsive to the skew detection. Third, examples disclosed herein protect the input pair by clamping voltage nodes of the inputs appropriately (e.g., clamp positive gate-to-source voltage only for a NBTI stress shift and clamp a negative gate-to-body voltage only for a PBTI stress shift) responsive to activating the auxiliary pair. Lastly, examples disclosed herein restore usage and/or operation of the main input pair responsive to the amplifier existing a skew operation and entering a regulation operation.

Figure 1A:
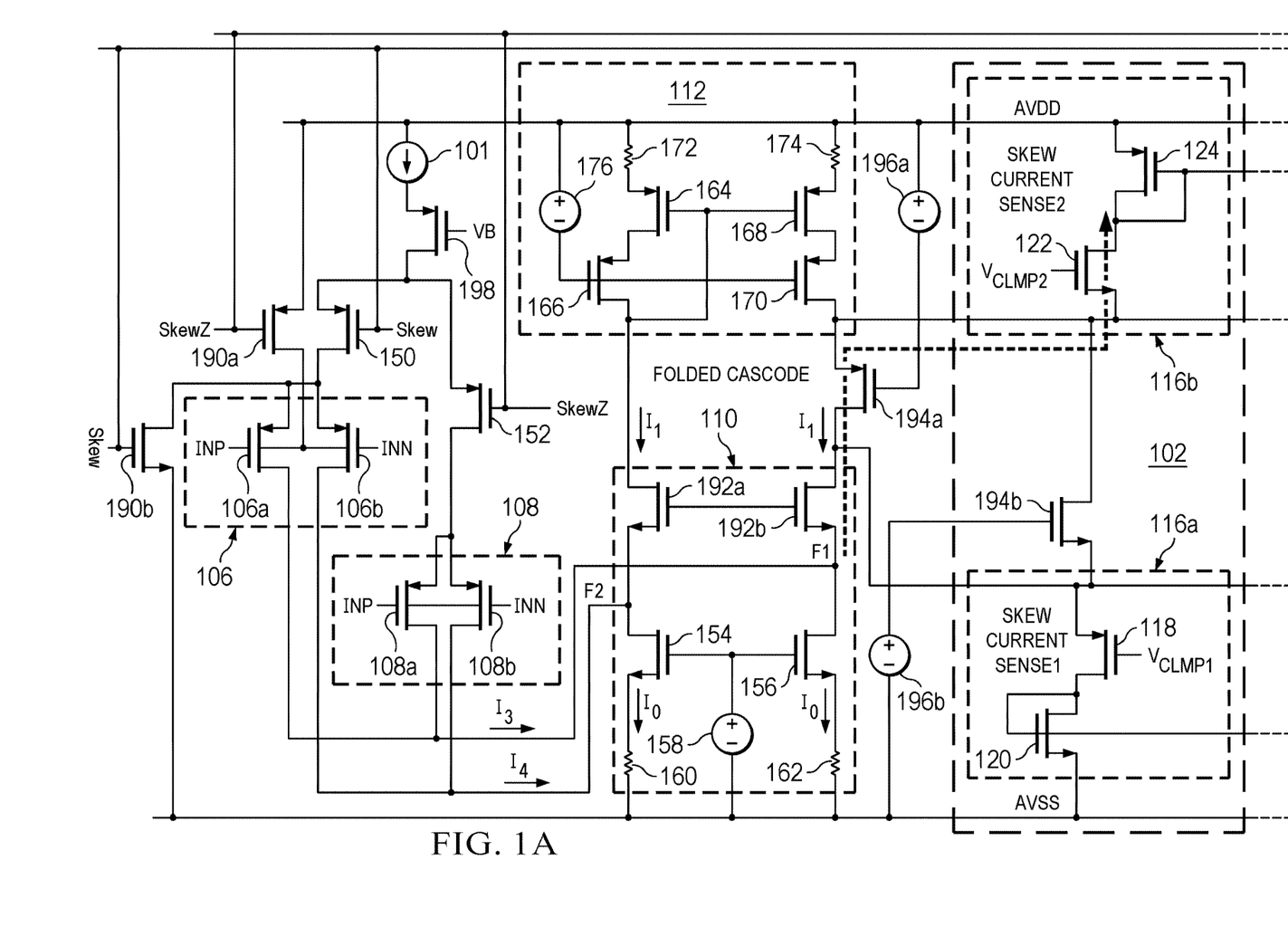
FIGS. 1A-1B (collectively FIG. 1) illustrate a schematic diagram of example amplifier circuitry including example clamping circuitry and example skew signal generation circuitry configured in a first mode of operation to facilitate sensing unregulated conditions occurring at an example main input pair.
Figure 1B:
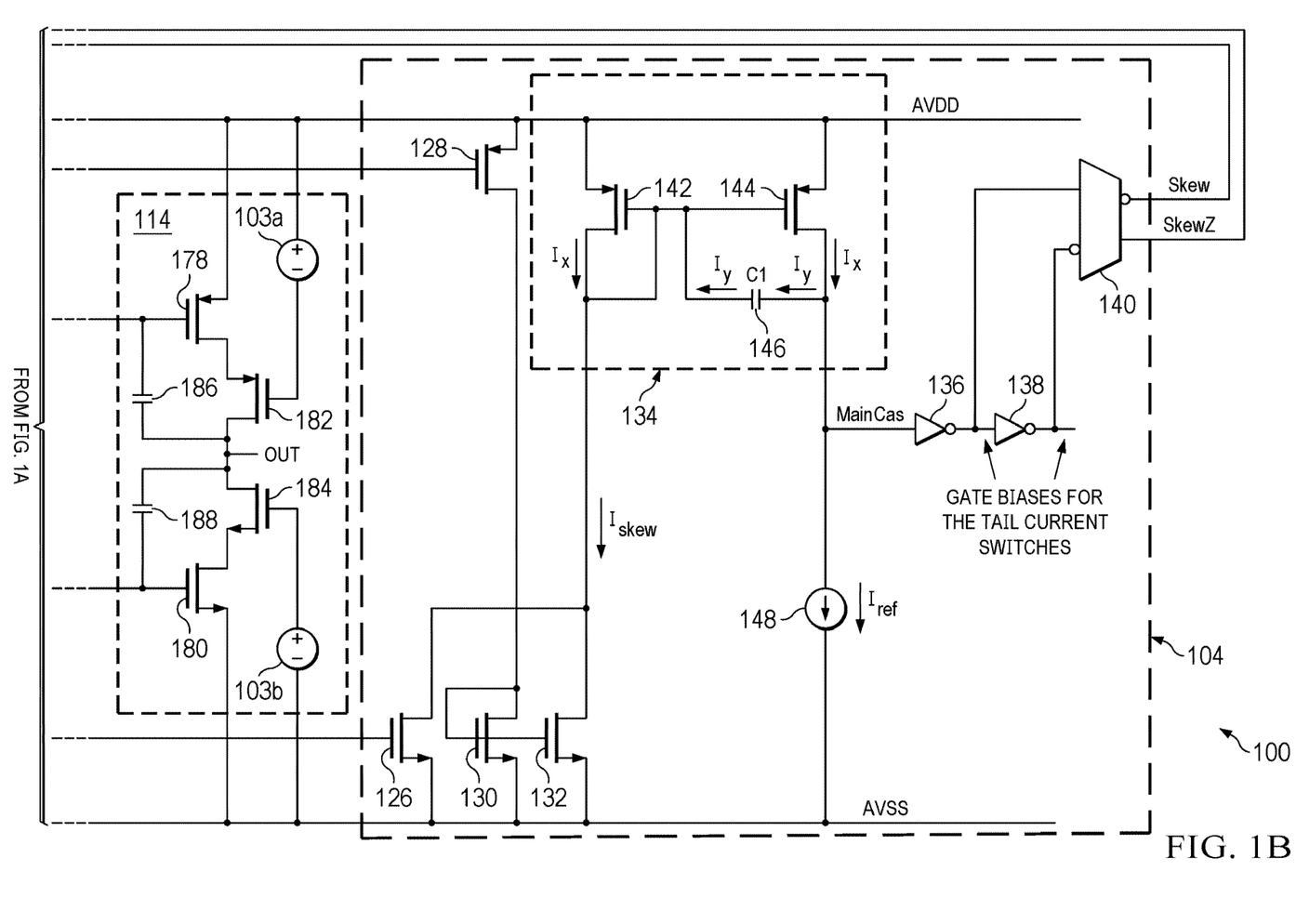

FIG. 1 is a schematic diagram of example amplifier circuitry 100 including example clamping circuitry 102 and example skew signal generation circuitry 104 to facilitate sensing unregulated conditions occurring at an example main input pair 106. The example amplifier circuitry 100 includes the example main input pair 106, an example auxiliary input pair 108, example folded cascode circuitry 110, an example current mirror 112, and an example output stage 114.

Conventionally, amplifiers subject to skew operations are designed to detect the skew conditions through a comparator directly monitoring the input pair. The comparator triggers in response to detecting a voltage offset between the main input pair that meets or exceeds a threshold. The comparator digitally switches a tail current (e.g., a current conducting through the main input pair) from the main input pair to the auxiliary input pair (and vice versa) in response to being triggered. Such digital switching is undesired for the amplifier circuitry because the amplifier circuitry is analog and the output profile of either of the input pairs during recovery from skew conditions looks sharp and/or abrupt and, thus, cause transient currents. In some examples, the voltage comparison of the inputs to a switching threshold voltage are limited in terms of the switching threshold voltage, because the switching threshold voltage has to be greater than the any potential offset shifts for the auxiliary pair to ensure that the amplifier does not get stuck in the auxiliary mode when the amplifier returns to regulation. Examples disclosed herein are not affected by ageing shifts and mismatches coming from the auxiliary pair, that occur when monitoring input voltage, by sensing an imbalance in the fold circuitry of the amplifier (e.g., utilizing the clamping circuitry 102). Current monitoring of the imbalance of the fold provides an advantage, in terms of robustness, against design limitations of the switching thresholds. As long as the amplifier returns to regulation (regardless of the front-end offset/shifts), the "current" balance of the fold is restored and thus guaranteeing a robust switch-over back to the main pair.

The example clamping circuitry 102 includes example first clamp circuitry 116a and example second clamp circuitry 116b. The example first clamp circuitry 116a includes an example first transistor 118 and an example second transistor 120. The example first transistor 118 includes a drain (e.g., current terminal, drain terminal, a collector terminal, etc.), a source (e.g., current terminal, source terminal, an emitter terminal, etc.), and a gate (e.g., base terminal, base, etc.). The example second transistor 120 includes a drain (e.g., current terminal, drain terminal, collector terminal, etc.), a source (e.g., current terminal, source terminal, an emitter terminal, etc.), and a gate (e.g., base terminal, base, etc.). The drain of the first transistor 118 is coupled to the drain of the second transistor 120. The gate of the second transistor 120 is coupled to the drain of the first transistor 118 and to the and drain of the second transistor 120. The source of the second transistor 120 is coupled to ground. The source of the first transistor 118 is coupled to an output of the example folded cascode circuitry 110. The first gate is configured to be coupled to a bias voltage (e.g., $V_{CLMP1}$).

The example second clamp circuitry 116b includes an example third transistor 122 and an example fourth transistor 124. A source of the third transistor 122 is coupled to an output of the current mirror 112. A drain of the third transistor 122 is coupled to a drain of the fourth transistor 124. The source of the third transistor 122 is coupled to the source of the first transistor 118 via a transistor 194b. A gate of the fourth transistor 124 is coupled to the drains of the third and fourth transistor 122, 124. The gate of transistor 122 is configured to be coupled to a bias voltage (e.g., $V_{CLMP2}$)

The first transistor 118 and the fourth transistor 124 are pMOSFETs. Alternatively, the first transistor 118 and the fourth transistor 124 may be P-channel field-effect transistors (FETs), P-type insulated-gate bipolar transistors (IGBTs), P-channel junction field effect transistors (JFETs), or PNP bipolar junction transistor (BJTs).

The second transistor 120 and the third transistor 122 are nMOSFETs. Alternatively, the second transistor 120 and the third transistor 122 may be N-channel field-effect transistors (FETs), N-channel insulated-gate bipolar transistors (IGBTs), N-channel junction field effect transistors (JFETs), or NPN bipolar junction transistor (BJTs).

The example skew signal generation circuitry 104 includes an example fifth transistor 126, an example sixth transistor 128, an example seventh transistor 130, an example eighth transistor 132, an example current mirror 134, an example first logic gate 136, an example second logic gate 138, and an example digital control generator 140. The current mirror 134 includes an example ninth transistor 142, an example tenth transistor 144, and an example capacitor 146. The example skew signal generation circuitry 104 includes an example reference current source 148.

A drain of the fifth transistor 126 is coupled to a drain of the ninth transistor 142. A gate of the fifth transistor 126 is coupled between the drain of the first transistor 118 and the drain of the second transistor 120. A drain of the sixth transistor 128 is coupled to a drain of the seventh transistor 130. A gate of the sixth transistor 128 is coupled to the gate of the fourth transistor 124, which is coupled between the drains of the third and fourth transistors 122, 124. A gate of the seventh transistor 130 is coupled to a drain of the seventh transistor 130 and to the drain of the sixth transistor 128. A drain of the eighth transistor 132 is coupled to a drain of the ninth transistor 142. A gate of the eighth transistor 132 is coupled to the gate of the seventh transistor 130, which is coupled to the drains of the sixth and seventh transistors 128, 130. A drain of the ninth transistor 142 is coupled to a gate of the ninth transistor 142, and the gate of the ninth transistor 142 is coupled to a gate of the tenth transistor 144. A drain of the tenth transistor 144 is coupled to the capacitor (C1) 146. The capacitor (C1) 146 includes a first capacitor terminal and a second capacitor terminal. The first capacitor terminal is coupled to the drain of the tenth transistor 144 and the second capacitor terminal is coupled to the gate of the tenth transistor 144.

In this example, the first logic gate 136 is an inverter and the second logic gate 138 is an inverter. Additionally and/or alternatively, the first logic gate 136 and the second logic gate 138 may be any type of logic gate, such as a logic NOR gate, a logic AND gate, a logic OR gate, etc.

The first logic gate 136 includes a first logic gate input and a first logic gate output. The second logic gate 138 includes a second logic gate input and a second logic gate output. The first logic gate input is coupled between the first capacitor terminal and the reference current source 148. The first logic gate output is coupled to the second logic gate input and to the digital control generator 140. The second logic gate output is coupled to digital control generator 140.

In this example, the digital control generator 140 is logic circuitry. The digital control generator 140 includes a first digital control input, a second digital control input, a first digital control output (Skew), and a second digital control output (SkewZ). The second digital control input is inverted. The first digital control output (Skew) is inverted. The first digital control output (Skew) is inverted to make the outputs of the digital control generator 140 complementary.

In this example, the tenth transistor 144 and the reference current source 148 comprise a current comparator. For example, a current ($I_X$) through the tenth transistor 144 is compared to a reference current ($I_{ref}$) of the reference current source 148 at a MainCas node. The current $I_X$ is compared to the reference current $I_{ref}$ to determine whether a skew condition has occurred. The first logic gate input is coupled to the MainCas node and, thus, the first logic gate input obtains a high current or a low current responsive to a comparison between $I_X$ and $I_{ref}$ at the MainCas node. An example operation of the skew signal generation circuitry 104 is described in further detail below:

The amplifier circuitry 100 includes the example main input pair 106, which includes a transistors 106a, 106b. The transistors 106a and 106b are PMOS input devices that are sized and/or biased based on considerations of noise, mismatch, gain, and bandwidth. The main input pair 106 receives a first input (INP) and a second input (INN) and includes a first output and a second output. The gates of transistors 106a, 106b are driven by the first input (INP) and the second input (INN), respectively. The drains of transistors 106a, 106b are coupled to a fold of the folded cascode circuitry 110 to transfer the input signal information (e.g., INP and INN) to the output stage 114. The fold of the folded cascode circuitry 110 is the portion of the circuitry that is coupled to an input pair, such that the folded cascode circuitry 110 obtains input signals to process (e.g., convert the input voltage INP and INN to a current).

The amplifier circuitry 100 includes a first switch 150, a second switch 152, a transistor 198, and a current source 101.

The source of transistor 106a is coupled to the source of transistor 106b. The common source (e.g., sources) of the two main input pair transistors 106a, 106b is coupled to a drain of the first switch 150. The common source of the two transistors 106a, 106b is driven by a fixed tail current whose conducting path is controlled by the first switch 150. A gate of the first switch 150 is coupled to the inverted output of the digital control generator 140. A source of the first switch 150 is coupled to the source of the second switch 152 and to the drain of transistor 198. The source of transistor 198 is coupled to the current source 101. The current source 101 is coupled to the supply voltage (AVDD).

In some examples, the inverted output of the digital control generator 140 outputs a "skew" detect signal to drive the gate of the first switch 150. For example, the "skew" detect signal may cause the first switch 150 to activate the main input pair 106 and/or disengage the main input pair 106 in response to an "unregulated" condition of the amplifier circuitry 100.

In an amplifier "regulated" condition, the amplifier circuitry 100 inputs INP and INN are approximately equal (e.g., limited by finite gain errors and offsets). In such a case, the amplifier circuitry 100 forces equal currents to the fold. For example, the first input (INP) is to obtain 5 volts and the amplifier circuitry 100 is to regulate the second input (INN) to 5 volts through negative feedback. Any potential unregulated condition, such as open loop condition, short condition, etc., results in skews in the input voltages between INP and INN. For example, the first input (INP) may be set at 5 volts and the second input (INN) may be set at 0V in a comparator mode. In such an example, the clamping circuitry 102 detects the skew between the two input voltages and the skew signal generation circuitry 104 outputs a signal to the first switch 150 that is indicative to clamp nodes of the main input pair 106. An example operation of the skew signal generation circuitry 104 is described in further detail below.

The amplifier circuitry 100 includes the example auxiliary input pair 108 to serve as an auxiliary sacrificial pair during the "skew" mode. The auxiliary input pair 108 includes transistors 108a, 108b. The transistors 108a. 108b are PMOS input devices. The auxiliary input pair 108 receives the first (INP) and the second input (INN). The auxiliary input pair 108 includes a third output and a fourth output. The gates of the two transistors 108a, 108b are driven by the first input (INP) and the second input (INN), respectively. Drains of the two transistors 108a, 108b are coupled to the fold of the folded cascode circuitry 110. The sources of transistors 108a. 108b are connected to form a common source (e.g., sources), that is coupled to a second switch 152. The source of transistor 108a is coupled to a drain of the second switch 152 and the source of transistor 108b is coupled to the drain of the second switch 152. The common source of the two transistors 108a, 108b is driven by a complementary switch (e.g., the second switch 152 which is complementary to the first switch 150) that is driven by the same tail current source. This arrangement ensures that the tail current is properly steered between the main input pair 106 (e.g., in normal mode) and the auxiliary input pair 108 (e.g., in the skew mode or during an "unregulated" condition). When the amplifier circuitry 100 is in normal mode (e.g., a "regulated" condition), the second switch 152 to the source of the auxiliary input pair 108 is turned OFF, thereby cutting off any signal path through the same. When "skew" mode is detected by the clamping circuitry 102 and the skew signal generation circuitry 104, the main input pair path is cut off, thereby allowing for a means to clamp particular input nodes, such as the common sources, the drain terminals, and body nodes of the main input pair 106 devices.

In this example, the auxiliary input pair 108 is to operate in response to a threshold input differential voltage input on the main input pair 106. Therefore, auxiliary input pair 108 comes into operation when the amplifier circuitry 100 is in an unregulated condition. In this example, the two transistors 108a, 108b of the auxiliary input pair 108 are smaller transistors than the transistors 106a, 106b of the main input pair 106. Therefore, the transistors 108a, 108b of the auxiliary input pair 108 have a greater input offset than the transistors 106a, 106b of the main input pair 106.

The first digital control output (Skew) of the digital control generator 140 is coupled to a gate (e.g., base terminal, base, etc.) of the first switch 150. The second digital control output (SkewZ) of the digital control generator 140 is coupled to a gate (e.g., base terminal, base, etc.) of the second switch 152. Signals (e.g., voltage signals) output by the digital control generator 140 are complementary because the first digital control output (Skew) is inverted and the second digital control output is not inverted (SkewZ). The first digital control output represents a "Skew" detection signal and the second digital control output represents a "SkewZ" signal.

The folded cascode circuitry 110 includes an example eleventh transistor 154, an example twelfth transistor 156, an example first voltage source 158, an example first resistor 160, an example second resistor 162, an example transistor 192a, and an example transistor 192b.

A source of the eleventh transistor 154 is coupled to the first resistor 160. A gate of the eleventh transistor 154 is coupled to a gate of the twelfth transistor 156. A drain of the eleventh transistor 154 is coupled to a source of the transistor 192a. The first voltage source 158 is coupled to the gates of the eleventh and twelfth transistor 154, 156. A source of the twelfth transistor 156 is coupled to the second resistor 162. A drain of the twelfth transistor 156 is coupled to a source of the transistor 192b. The second output of the main input pair 106 is coupled to the drain of the eleventh transistor 154 and to the source of the transistor 192a. The fourth output of the auxiliary input pair 108 is coupled to the drain of the eleventh transistor 154 and to the source of the transistor 192a. The first output of the main input pair 106 is coupled to the drain of the twelfth transistor 156 and to the source of the transistor 192b and the third output of the auxiliary input pair 108 is coupled to the drain of the twelfth transistor 156 and to the source of the transistor 192b. In this example, the gates of transistors 192a, 192b are biased by a voltage (not shown).

In this example, the folded cascode circuitry 110 is a first stage of the amplifier circuitry 100. The folded cascode topologies offer better common mode compliance and higher gains compared to non-cascoded topologies.

The amplifier circuitry 100 includes the current mirror 112 to mirror current of the folded cascode circuitry 110. The current mirror 112 includes an example thirteenth transistor 164, an example fourteenth transistor 166, an example fifteenth transistor 168, an example sixteenth transistor 170, an example third resistor 172, an example fourth resistor 174, and an example second voltage source 176. The third resistor 172, thirteenth transistor 164, and the fourteenth transistor 166 comprise (e.g., make up) the left branch of the current mirror 112. The fourth resistor 174, fifteenth transistor 168, and the sixteenth transistor 170 comprise (e.g., make up) the right branch of the current mirror 112.

A source of the thirteenth transistor 164 is coupled to the third resistor 172. A gate of the thirteenth transistor 164 is coupled to a gate of the fifteenth transistor 168 and to a drain of the fourteenth transistor 166. A drain of the thirteenth transistor 164 is coupled to a source of the fourteenth transistor 166. A gate of the fourteenth transistor 166 is coupled to the second voltage source 176. The drain of the fourteenth transistor 166 is coupled to the drain of the eleventh transistor 154, via transistor 192a, and to the second and fourth outputs of the main input pair 106 and the auxiliary input pair 108, respectively, via the transistor 192a. A source of the fifteenth transistor 168 is coupled to the fourth resistor 174. A drain of the fifteenth transistor 168 is coupled to a source of the sixteenth transistor 170. The gate of fourteenth transistor 166 and a gate of the sixteenth transistor 170 are coupled to the second voltage source 176. A drain of the sixteenth transistor 170 is coupled to the drain of the twelfth transistor 156, via transistor 194a and transistor 192b, and to the first and third outputs of the main input pair 106 and the auxiliary input pair 108, respectively, via the transistor 192b.

The amplifier circuitry 100 includes the transistor 194a and the transistor 194b. The transistor 194a includes a drain, source, and gate. The transistor 194b includes a drain, source, and gate. The drain of the transistor 194a is coupled to drain of the transistor 192b. The source of the transistor 194a is coupled to the drain of the sixteenth transistor 170. The gate of the transistor 194a is coupled to a third voltage source 196a. The drain of transistor 194b is coupled to the source of the third transistor 122 and to the drain of the sixteenth transistor 170. The source of transistor 194b is coupled to the source of the first transistor 118 and to the drains of transistors 192b and 194a. The gate of transistor 194b is coupled to a fourth voltage source 196b.

The amplifier circuitry 100 includes the example output stage 114 to output a signal, output by the folded cascode circuitry 110, having a certain amount of power to a load. In this example, the output stage 114 includes a seventeenth transistor 178, an eighteenth transistor 180, a nineteenth transistor 182, a twentieth transistor 184, a second capacitor 186, a third capacitor 188, a fifth voltage source 103a, and a sixth voltage source 103b.

A drain of the seventeenth transistor 178 is coupled to a source of the nineteenth transistor 182. A gate of the seventeenth transistor 178 is coupled to the drain of the sixteenth transistor 170. The second capacitor 186 is coupled between the gate of the seventeenth transistor 178 and a drain of the nineteenth transistor 182. A drain of the eighteenth transistor 180 is coupled to a source of the twentieth transistor 184. A gate of the eighteenth transistor 180 is coupled to the source of transistor 194b, to the source of the first transistor 118, and to the drains of transistors 192b and 194a. The fifth voltage source 103a is coupled between the gate of nineteenth transistor 182 and a supply voltage (AVDD). The sixth voltage source 103b is coupled to a gate of the twentieth transistor 184. The third capacitor 188 is coupled between the gate of the eighteenth transistor 180 and a drain of the twentieth transistor 184. The drain of the nineteenth transistor 182 is coupled to the drain of the twentieth transistor 184. An output of the output stage 114 is between the drains of the nineteenth transistor 182 and the twentieth transistor 184.

In this example, the seventeenth transistor 178 is cascoded with the nineteenth transistor 182 and the eighteenth transistor 180 is cascoded with the twentieth transistor 184. In this example, the nineteenth transistor 182 and the twentieth transistor 184 are drain extended devices. The extension of a transistor's drain is a manufacturing technique utilized to increase the voltage of the transistor. For example, in a drain extended device (e.g., transistor, MOSFET, etc.), the drain region is spaced from the channel of the device and from the gate of the device, rather than connected directly to the channel. The spacing between the drain and the channel spreads out electric fields, thereby increasing breakdown voltage rating of the device. The breakdown voltage rating of a transistor is the maximum voltage that the transistor can handle for each of its three junctions (e.g., drain, source, and gate). In some examples, if the transistor receives voltages that exceed the breakdown voltage rating, the transistor will be destroyed. Therefore, increasing the breakdown voltage rating increases the voltage of the transistor. The seventeenth and eighteenth transistors 178, 180 are cascoded with drain extended devices for supporting high voltage operations.

The example amplifier circuitry 100 includes an example first clamping transistor 190a and an example second clamping transistor 190b to clamp nodes of the main input pair 106 during a "Skew" operation. The amplifier circuitry 100 includes an example transistor 198 and an example current source 101. The first clamping transistor 190a includes a drain, a source, and a gate. The second clamping transistor 190b includes a drain, a source, and a gate.

The gate of the first clamping transistor 190a is coupled to the second digital control output (SkewZ) and is configured to receive a voltage signal corresponding to "SkewZ." The drain of the first clamping transistor 190a is coupled to a common body terminal of the main input pair devices (e.g., transistors 106a. 106b). For example, a body of the transistor 106a is coupled to a body of transistor 106b, and the drain of the first clamping transistor 190a is coupled to both the bodies of the main input pair transistors 106a. 106b. The gate of the second clamping transistor 190b is coupled to the first digital control output (Skew) and is configured to receive a voltage signal corresponding to "Skew." The drain of the second clamping transistor 190b is coupled to the common source of the main input pair transistors 106a. 106b.

The following description corresponds to an example first operation of the clamping circuitry 102. The example first clamp circuitry 116a and the example second clamp circuitry 116b monitor either direction of the skew (e.g., when voltage at the positive input/first input INP is greater than voltage at negative input/second input INN or vice versa). In this example operation, the voltage at the first input (INP) of the main input pair 106 is five volts greater than the voltage at the second input (INN). For example, the voltage at the first input (INP) is five volts and the voltage at the second input (INN) is zero volts. This differential voltage creates a differential current ($\Delta I$) at the fold of the folded cascode circuitry 110. For example, the differential voltage at the inputs (e.g., the gates of 106a and 106b) of the main input pair 106 cause the main input pair 106 to inject a greater current into the second node (F2) than the first node (F1). As such, the current $I_3$ is less than current $I_4$. In this example, if the current ($I_3$) is less than the current ($I_4$), the differential current ($\Delta I$) (e.g., the difference between currents $I_3$ and $I_4$) flows through the second clamp circuitry 116b.

Figure 2A:
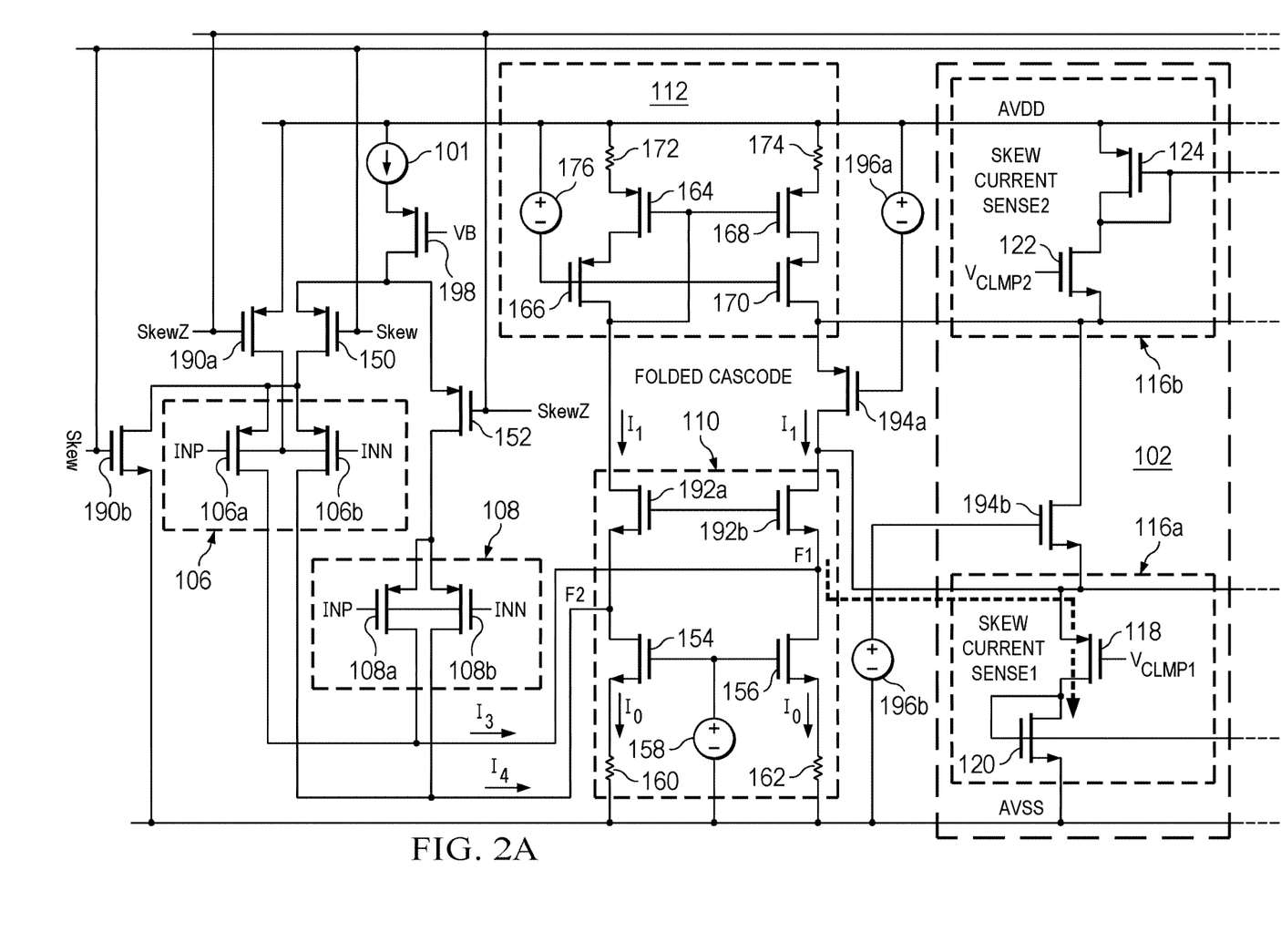
FIGS. 2A-2B (collectively FIG. 2) illustrate another schematic illustration of the amplifier circuitry of FIG. 1 depicting a second mode of operation when monitoring an unregulated condition that is different than the unregulated condition illustrated in FIG. 1.
Figure 2B:
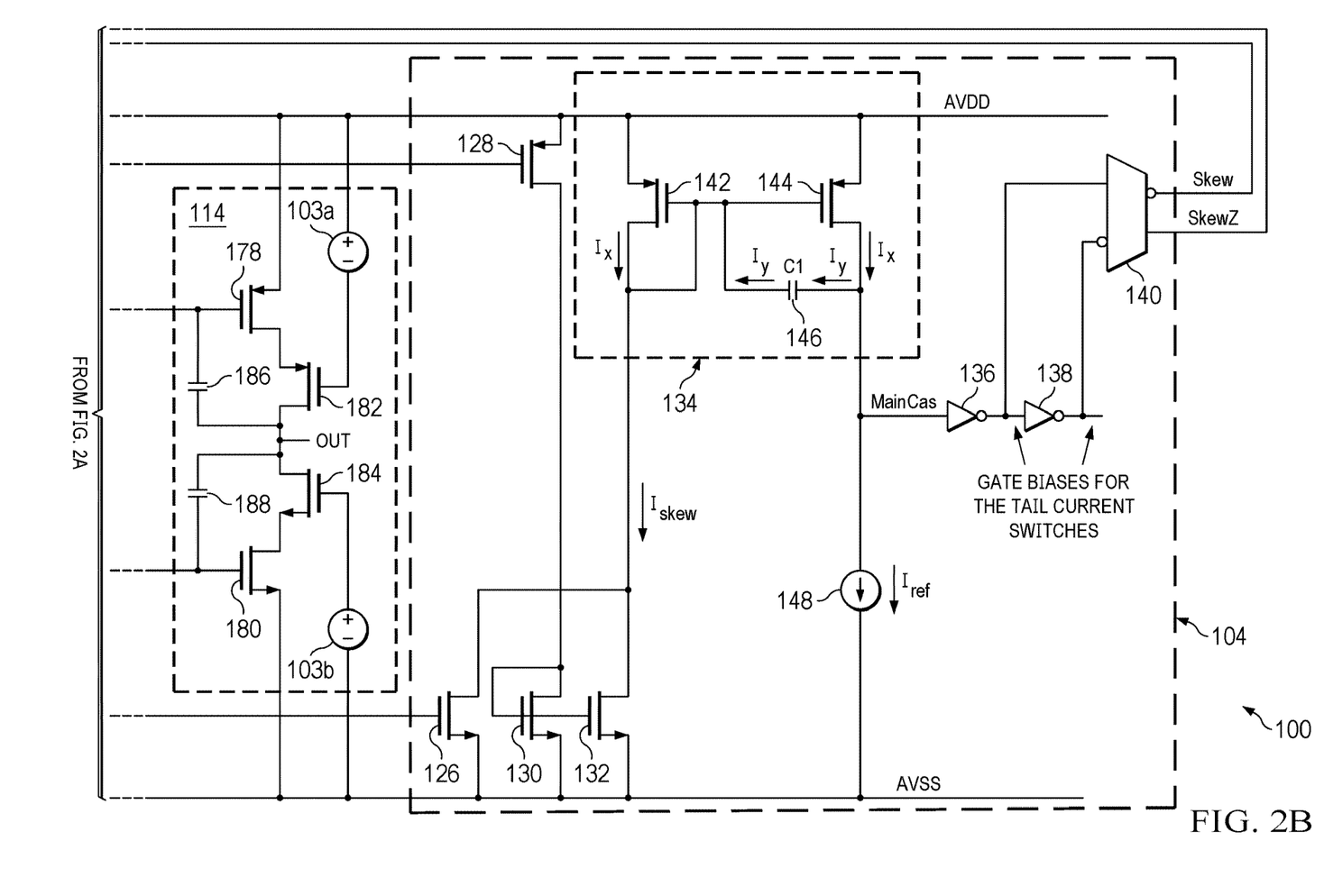

The eleventh transistor 154 and the twelfth transistor 156 conduct current $I_0$. The example current mirror 112 mirrors current ($I_1$) on the left branch of the current mirror 112 and the right branch of the current mirror 112. The current $I_1$ is equivalent to a difference between the current of the drain of the fourteenth transistor 166 and the current injected into node F2 ($I_4$). In some examples, if the current ($I_3$) is greater than the current ($I_4$), the differential current ($\Delta I$) flows through the first clamp circuitry 116a, discussed in further detail below in connection with FIGS. 2A-2B (FIG. 2).

In this example, the skew condition (e.g., the unregulated condition) is detected responsive to the differential current (e.g., the difference between currents $I_3$ and $I_4$) flowing through either the first clamp circuitry 116a or the second clamp circuitry 116b. Generally, when there is no skew condition (e.g., no differential input voltage), there is zero or approximately zero current flowing through either the first clamp circuitry 116a or the second clamp circuitry 116b.

In this example, the skew signal generation circuitry 104 receives the current from the second clamp circuitry 116b, sums the current, and detects whether the sum of the current from the second clamp circuitry 116b meets a threshold current, the threshold current indicative of a skew condition. If the sum of the currents meets or exceeds the threshold current, the skew signal generation circuitry 104 outputs a skew signal to clamp nodes of the main input pair 106 and provide current to the auxiliary input pair 108 in order to preserve the main input pair 106 from the negative effects of the skew condition.

For example, the skew signal generation circuitry 104 receives the current from the second clamp circuitry 116b at the drain of the eighth transistor 132 when the drain of the sixth transistor 128 conducts current responsive to a current flowing through the second clamp circuitry 116b. The seventh transistor 130 mirrors the current of the drain of the sixth transistor 128 at the drain of the eighth transistor 132. The current mirror 134 mirrors the current ($I_X$) of the drain of the eighth transistor 132 at the drain of the tenth transistor 144. The skew signal generation circuitry 104 compares the current ($I_X$) to a reference current ($I_{ref}$) of the reference current source 148. The results of the comparison are output at the MainCas node. For example, the comparison between the current ($I_X$) and the reference current ($I_{ref}$) generates skew current ($I_Y$). In some examples, the skew current ($I_Y$) is equivalent to the current $I_X$ minus the reference current ($I_{ref}$) divided by two. The current at the MainCas node generates the skew signal that controls the switching between the main input pair 106 and the auxiliary input pair 108.

The skew signal generation circuitry 104 should not trigger (e.g., should not detect a skew condition of the main input pair 106) during large signal transients, to ensure that the amplifier circuitry 100 does not go into the "skew" mode to trigger the auxiliary input pair 108 during large signal events. Examples disclosed herein avoid triggering during large signal events through the clamping circuitry 102. Any large signal slewing activity of the amplifier circuitry 100 causes, first, the differential fold currents (e.g., the difference between currents $I_3$ and $I_4$) to charge the first capacitor 146 (e.g., the compensation capacitor) before triggering the first transistor 118 and/or third transistor 122. Therefore, any current that is sensed by the first transistor 118 and/or third transistor 122 is indicative of input skews beyond conventional slewing. In some examples, additional delays could be introduced in the skew signal generation circuitry 104 to ensure that the skew signal generation circuitry 104 does not trigger a skew signal during normal operation (e.g., during a regular slewing operation). For example, a delay is defined to delay the output of current ($I_Y$) at the MainCas node. For example, the first capacitor C1 is coupled between the gate of the tenth transistor 144 and the drain of the tenth transistor 144 to delay the output of the skew current ($I_Y$). The first capacitor C1 delays the output of the current ($I_Y$) through its charging and discharging operations. In some examples, the delay ensures that the skew current ($I_Y$) is not triggered during normal slewing operations because the size of the first capacitor C1 is selected in such a manner in order to ensure that normal slewing operations are not affected. For example, the size (e.g., the value of the capacitance) of the first capacitor C1 is selected such that the skew current ($I_Y$) divided by the capacitance of C1 is less than a slew rate of the amplifier circuitry 100.

In the example first operation, a voltage signal is generated at the MainCas node from the skew current ($I_Y$) and the stored charge of the first capacitor C1. The voltage signal at the MainCas node is provided to the first logic gate 136. In this example, the voltage signal at the MainCas node is high responsive to the skew condition. Therefore, the first logic gate 136 outputs a logic low signal. The second logic gate 138 obtains the logic low signal from the first logic gate 136 and outputs a logic high signal. The logic low signal of the first logic gate 136 is provided to the first digital control input of the digital control generator 140. The logic high signal output by the second logic gate 138 is provided to the second digital control input of the digital control generator 140. The digital control generator 140 outputs a logic high signal at the first digital control output (Skew) and a logic low signal at the second digital control output (SkewZ), because the first digital control output (Skew) is inverted and the second digital control input (SkewZ) is not inverted.

In the example first operation, the first switch 150 receives the logic high signal from the first digital control output (Skew) of the digital control generator 140. The first switch 150 turns off responsive to the logic high signal. For example, the first switch 150 is a pMOSFET and turns off responsive to a positive gate to source voltage (e.g., when the gate voltage is more positive than a threshold voltage across the drain to source region of the switch 150). The first clamping transistor 190a obtains the logic low signal from the second digital control output (SkewZ) and turns on, pulling the potential at the common body of the main input pair transistors 106a. 106b up to supply voltage. The second clamping transistor 190b obtains the logic high signal from the first digital control output (Skew) and turns on, pulling the potential at the common source of the main input pair transistors 106a. 106b to AVSS (e.g., ground). In some examples, the potential at the drains of the main input pair transistors 106a. 106b are pulled to ground responsive to the logic high signal from the first digital control output (Skew). Concurrently, the second switch 152 receives the logic low signal from the second digital control output (SkewZ) of the digital control generator 140. The second switch 152 turns on responsive to the logic low signal. For example, the second switch 152 is a pMOSFET and turns on responsive to a negative gate to source voltage (e.g., when the gate voltage is more negative than the threshold voltage across the drain to source region of the switch 152).

In the example first operation, the main input pair 106 turns off responsive to the first switch 150 turning off and responsive to the clamping of the common body and common source of the main input pair transistors 106a, 106b. The main input pair 106 stops outputting current at the folds (F1, F2). The auxiliary input pair 108 turns on responsive to the second switch 152 turning on. The auxiliary input pair 108 outputs current to the folds (F1, F2). In this example, the amplifier circuitry 100 utilizes the auxiliary input pair 108 instead of the main input pair 106, while the skew condition occurs. For example, the auxiliary input pair 108 acts as a sacrificial input device that will degrade during the skew condition, in place of the main input pair 106.

In the example first operation, the skew signal generation circuitry 104 continues to monitor and/or sum current from the second clamping circuitry 116b. The skew signal generation circuitry 104 stops generating a skew current ($I_Y$) that is greater than the reference current ($I_{ref}$) responsive to current Is equaling 14. For example, the inputs (INP. INN) may become equivalent (e.g., 5 volts, 5 volts) and, thus, the current injected into the first node (F1) becomes equal to the current injected into the second node (F2). The current injected into the first node F1 ($I_3$) becomes equal to or approximately equal to the current injected into the second node F2 (14). The second clamp circuitry 116b conducts zero or approximately zero current responsive to no differential current (ΔI) at the fold. The current $I_X$ decreases below the reference current ($I_{ref}$) responsive to zero or approximately zero current flowing through the second clamping circuitry 116b. Therefore, the voltage signal at the MainCas node is a logic low; and the outputs of the digital control generator 140 revert back to outputs that facilitate normal operation of the amplifier circuitry 100. For example, first digital control output (Skew) is a logic low and the second digital control output (SkewZ) is a logic high, which turns on the main input pair 106 and turns off the auxiliary input pair 108. As such, normal operation is restored.

FIGS. 2A and 2B, collectively FIG. 2, illustrate another schematic illustration of the amplifier circuitry 100 of FIG. 1. For example, the amplifier circuitry 100 depicted in FIG. 2 (FIGS. 2A and 2B) corresponds to the amplifier circuitry 100 of FIG. 1 (FIGS. 1A and 1B). In the illustrated example of FIG. 2, the amplifier circuitry 100 is configured in a second mode of operation to monitor a skew condition that is different than the skew condition illustrated in FIG. 1.

In the example second operation, the voltage at the first input (INP) of the main input pair 106 is five volts less than the voltage at the second input (INN). For example, the voltage at the first input (INP) is zero volts and the voltage at the second input (INN) is five volts. This differential voltage creates a differential current (ΔI) at the fold of the folded cascode circuitry 110. For example, the differential voltage at the inputs (INP, INN) of the main input pair 106 causes the main input pair 106 to inject a greater current into the first node (F1) than the second node (F2). As such, the current $I_3$ is greater than current $I_4$. In this example, if the current ($I_3$) is greater than the current ($I_4$), the differential current (ΔI) (e.g., the difference between currents $I_3$ and $I_4$) flows through the first clamp circuitry 116a.

In this example, the skew condition is detected responsive to the differential current (e.g., the difference between currents $I_3$ and $I_4$) flowing through the first clamp circuitry 116a. In this example, the skew signal generation circuitry 104 receives the current from the first clamp circuitry 116a, sums the current, and detects whether the sum of the current from the first clamp circuitry 116a meets or exceeds a threshold current, the threshold current indicative of a skew condition. If the sum of the currents meets or exceeds the threshold current, the skew signal generation circuitry 104 outputs a skew signal to switch between the main input pair 106 and the auxiliary input pair 108 in order to preserve the main input pair 106 from the negative effects of the skew condition.

For example, the skew signal generation circuitry 104 receives the current from the first clamp circuitry 116a at the drain of the eighth transistor 132 when the drain of the fifth transistor 126 conducts current responsive to a current flowing through the first clamp circuitry 116a. The current mirror 134 mirrors the current ($I_X$) of the drain of the eighth transistor 132 at the drain of the tenth transistor 144. The skew signal generation circuitry 104 compares the current ($I_X$) to a reference current ($I_{ref}$) of the reference current source 148. The results of the comparison are output at the MainCas node. For example, the comparison between the current ($I_X$) and the reference current ($I_{ref}$) generates skew current ($I_Y$). In some examples, the skew current ($I_Y$) is equivalent to the current $I_X$ minus the reference current ($I_{ref}$) divided by two. The current at the MainCas node ($I_Y$) generates the skew signal that controls the switching between the main input pair 106 and the auxiliary input pair 108.

In the example second operation, a voltage signal is generated at the MainCas node from the skew current ($I_Y$) and the stored charge of the first capacitor C1. The voltage signal at the MainCas node is received at the input of the first logic gate 136. In this example, the voltage signal at the MainCas node is high responsive to the skew condition. Therefore, the first logic gate 136 outputs a logic low signal. The second logic gate 138 receives the logic low signal from the first logic gate 136 and outputs a logic high signal. The logic low signal of the first logic gate 136 is provided to the first digital control input of the digital control generator 140. The logic high signal output by the second logic gate 138 is provided to the second digital control input of the digital control generator 140. The digital control generator 140 outputs a logic high signal at the first digital control output (Skew) and a logic low signal at the second digital control output (SkewZ), because the first digital control output (Skew) is inverted and the second digital control input is not inverted (SkewZ).

In the example second operation, the first switch 150 obtains the logic high signal from the first digital control output (Skew) of the digital control generator 140. The first switch 150 turns off responsive to the logic high signal. The first clamping transistor 190a obtains the logic low signal from the second digital control output (SkewZ) and turns on, pulling the potential at the common body of the main input pair transistors 106a. 106b up to supply voltage. The second clamping transistor 190b obtains the logic high signal from the first digital control output (Skew) and turns on, pulling the potential at the common source of the main input pair transistors 106a. 106b to ground. Concurrently, the second switch 152 obtains the logic low signal from the second digital control output (SkewZ) of the digital control generator 140.

In the example second operation, the main input pair 106 turns off responsive to the first switch 150 turning off and responsive to the clamping of the common body and common source of the main input pair transistors 106a, 106b. The main input pair 106 stops outputting current at the folds (F1. F2). The auxiliary input pair 108 turns on responsive to the second switch 152 turning on. The auxiliary input pair 108 outputs current ($I_3$ and $I_4$) at the folds (F1, F2). In this example, the amplifier circuitry 100 utilizes the auxiliary input pair 108 instead of the main input pair 106, while the skew condition occurs.

In the example second operation, the skew signal generation circuitry 104 continues to monitor and/or sum current from the first clamping circuitry 116a. The skew signal generation circuitry 104 stops generating a skew current ($I_Y$) that is greater than the reference current ($I_{ref}$) responsive to current Is equaling 14. For example, the inputs (INP, INN) may become equivalent (e.g., 5 volts, 5 volts) and, thus, the current injected into the first node (F1) becomes equal to the current injected into the second node (F2). The current $I_3$ becomes equal to and/or approximately equal to the current $I_4$. The first clamp circuitry 116a conducts zero and/or approximately zero current responsive to the current Is equaling to and/or approximately equaling the current $I_4$. The current $I_X$ decreases below the reference current ($I_{ref}$) responsive to zero and/or approximately zero current flowing through the first clamping circuitry 116a. Therefore, the voltage signal at the MainCas node is a logic low, and the outputs of the digital control generator 140 revert back to values that facilitate normal operation of the amplifier circuitry 100. For example, first digital control output (Skew) is a logic low and the second digital control output (SkewZ) is a logic high, which turns on the main input pair 106 and turns off the auxiliary input pair 108. As such, normal operation is restored.

Figure 3:
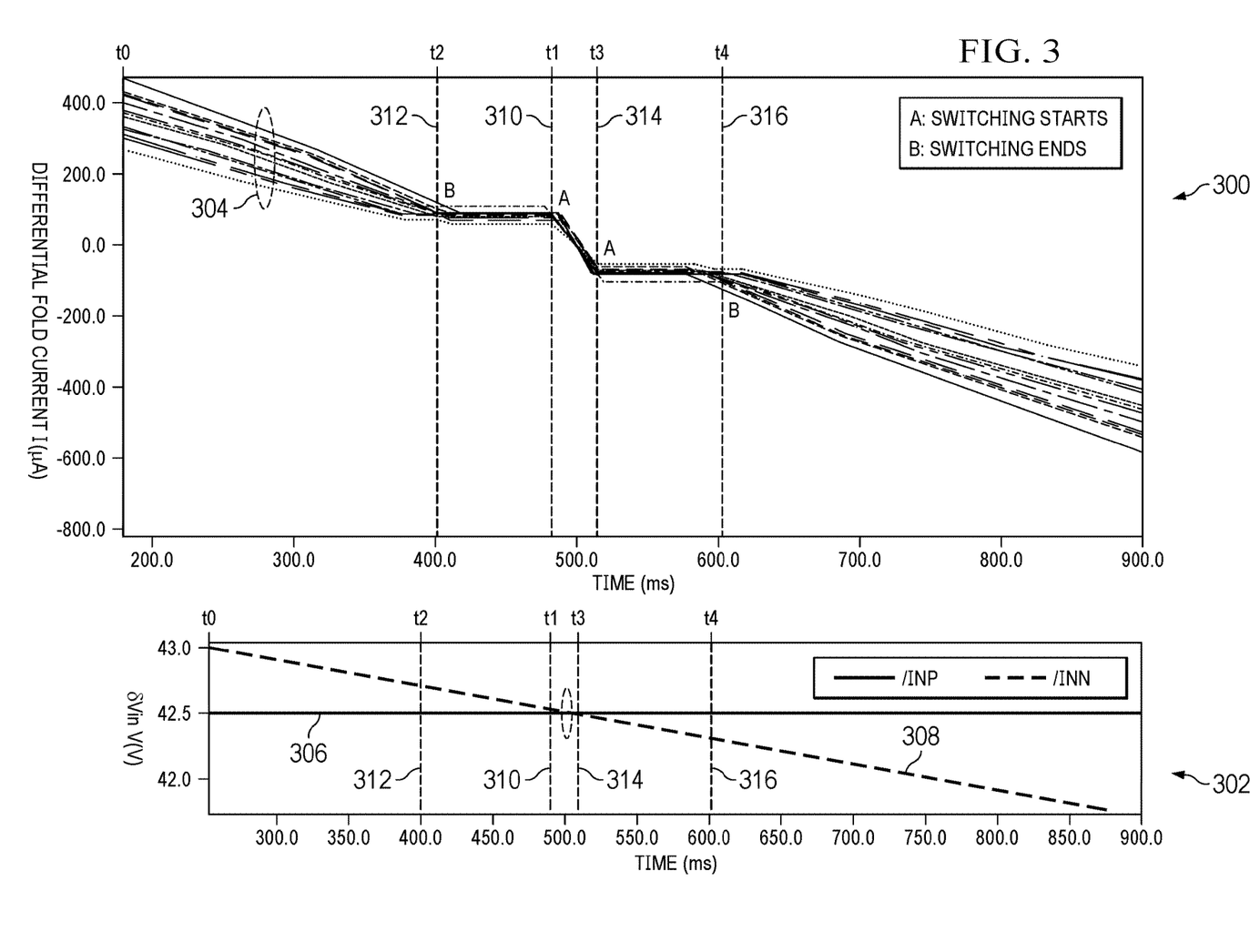
FIG. 3 illustrates a first signal plot depicting differential fold current versus time and a second signal plot depicting input voltages versus time.

FIG. 3 illustrates a first signal plot 300 depicting differential fold current versus time and a second signal plot 302 depicting input voltages versus time. The first signal plot 300 includes differential current lines 304 plotted over time. The differential current lines 304 correspond to the difference in current between $I_3$ and $I_4$ over different process variations (such as "process corners"). As used herein, a process corner is an example of a design-of-experiments technique that looks at device performance based on device fabrication process deviations where each "corner" represents an extreme deviation in one or more process conditions. Process corners represent the extremes of these parameter variations within which a circuit (e.g., amplifier circuitry 100) that has been formed on/over a semiconductor wafer must function correctly. A circuit (e.g., the amplifier circuitry 100) running on devices fabricated at these process corners may run slower or faster than specified and at lower or higher temperatures and voltages. The second signal plot 302 includes a first input line 306 and a second input line 308. The first input line 306 corresponds to the voltage across the first input (INP) of the main input pair 106 and the second input line 308 corresponds to the voltage across the second input (INN) of the main input pair 106.

In the illustrated example of FIG. 3, second signal plot 302 depicts the second input line 308 as having a greater voltage than the first input line 306 at time t0. The differential current lines 304 depict the differential current (ΔI) as equivalent to 400 microamps (μA). For example, because the inputs of the main input pair 106 are not equal, there is a differential current between $I_3$ and $I_4$. In this example at time to, the main input pair 106 is off and the auxiliary input pair 108 is on.

At a first time 310 (t1), the first input line 306 and the second input line 308 start to indicate different voltages. For example, the first input line 306 indicates a voltage of 42.50 volts and the second input line 308 indicates a voltage of approximately 42.55 volts. In this example, at the first time (t1) 310, the differential current is approximately 100 microamps, as depicted by the differential current lines 304. At the first time (t1) 310, the amplifier circuitry 100 starts switching from the main input pair 106 to the auxiliary input pair 108. For example, the clamping circuitry 102 detects a differential voltage at the main input pair 106 (e.g., depicted by the first input line 306 and the second input line 308) and the skew signal generation circuitry 104 outputs a skew signal that turns off the main input pair 106 and turns on the auxiliary input pair 108.

At a second time (t2) 312, the switching between the main input pair 106 and the auxiliary input pair 108 is complete. For example, the time it takes to cut off current to the main input pair 106 and clamp the input nodes, and then steer the current to the auxiliary input pair 108 is indicated by a difference in time between the first time (t1) 310 and the second time (t2) 312. In this example, the amplifier circuitry 100 takes approximately 90 milliseconds (ms) to switch from the main input pair 106 to the auxiliary input pair 108.

At a third time (t3) 314, the first input line 306 and the second input line 308 start to indicate different voltages. For example, the first input line 306 indicates a voltage of 42.50 volts and the second input line 308 indicates a voltage of approximately 42.45 volts. In this example, at the third time (t3) 314, the differential current is approximately –100 microamps, as depicted by the differential current lines 304. At the third time (t3) 314, the amplifier circuitry 100 starts switching between the main input pair 106 and the auxiliary input pair 108. For example, the clamping circuitry 102 detects the differential voltage between the first input (INP) and the second input (INN) and the skew signal generation circuitry 104 outputs a skew signal that turns off the main input pair 106 and turns on the auxiliary input pair 108.

At a fourth time (t4) 316, the switching between the main input pair 106 and the auxiliary input pair is complete. For example, the time is takes to turn off the main input pair 106 and turn on the auxiliary input pair 108 is indicated by a difference in time between the third time (t3) 314 and the fourth time (t4) 316.

In this description, the term "and/or" (when used in a form such as A, B and/or C) refers to any combination or subset of A, B, C, such as: (a) A alone: (b) B alone: (c) C alone; (d) A with B: (e) A with C: (f) B with C: and (g) A with B and with C. Also, as used herein, the phrase "at least one of A or B" (or "at least one of A and B") refers to implementations including any of: (a) at least one A: (b) at least one B: and (c) at least one A and at least one B.

Example methods, apparatus and articles of manufacture described herein improve long term precision and performance of amplifiers by preserving the main input device from stress conditions that result in degradation of the input devices. Examples described herein improve long term precision and performance by implementing an analog detecting and control mechanism that detects when a stress condition occurs at the main input device and switches to a sacrificial input device without utilizing digital switching by a comparator, wherein the digital switching causes abrupt and/or transient currents at the output of the amplifier. Examples disclosed herein trigger a switching between main input device and sacrificial input device during prolonged stress conditions and not during standard large signal transient events. Examples disclosed herein are immune to any offset shifts or mismatches of the sacrificial input pair.

Example methods, apparatus, systems, and articles of manufacture to improve performance of amplifiers are disclosed herein. Further examples and combinations thereof include the following:

Example 1 includes an amplifier (100) comprising folded cascode circuitry (110) having an input and an output, an input pair (106) coupled to the input, clamp circuitry (116) including a first transistor (118) having a first drain, a first source, and a first gate, the first source coupled to the output, a second transistor (120) having a second drain, a second source, and a second gate, the second drain coupled to the first drain and the second gate coupled to the first drain and second drain, a third transistor (122) having a third drain, a third source, and a third gate, the third source coupled to the output, and a fourth transistor (124) having a fourth drain, a fourth source, and a fourth gate, the fourth drain coupled to the third drain and the fourth gate coupled to the third drain and the fourth drain.

Example 2 includes the amplifier (100) of example 1, wherein the amplifier (100) further includes a fifth transistor (126) having a fifth drain, a fifth source, and a fifth gate, the fifth gate coupled to the second gate and the second drain, and a current mirror (134) including a current mirror input coupled to the fifth drain, a current mirror output, and a capacitor (146) coupled to the output.

Example 3 includes the amplifier (100) of example 1, wherein the amplifier (100) further includes a fifth transistor (128) having a fifth drain, a fifth source, and a fifth gate, the fifth gate coupled to the fourth gate and the fourth drain, a sixth transistor (130) having a sixth drain, a sixth source, and a sixth gate, the sixth drain coupled to the fifth drain and the sixth gate coupled to the sixth drain, a seventh transistor (132) having a seventh drain, a seventh source, and a seventh gate, the seventh gate coupled to the sixth gate and the sixth drain, a current mirror (134) including a current mirror input coupled to the seventh drain, a current mirror output, and a capacitor (146) coupled to the output.

Example 4 includes the amplifier (100) of example 1, wherein the amplifier (100) further includes a current mirror (134) having a current mirror input and a current mirror output, a reference current source (148) coupled to the current mirror output, a first logic gate (136) having a first logic gate input and a first logic gate output, the first logic gate input coupled to the current mirror output and the reference current source (148), a second logic gate (138) having a second logic gate input and a second logic gate output, the second logic gate input coupled to the first logic gate output, a digital control generator (140) having a first digital control input, a second digital control input, a first digital control output (Skew), and a second digital control output (SkewZ), the first digital control input coupled to the first logic gate output, the second digital control input coupled to the second logic gate output, and a first switch (150) having first switch input and a first switch output, the first switch input coupled to the first digital control output (Skew) and the first switch output coupled to the input pair (106).

Example 5 includes the amplifier of example 1, wherein input pair (106) is a first input pair (106) and the amplifier includes a second input pair (108) coupled to the input, and a first switch (152) having a first switch input and a first switch output, the first switch output coupled to the second input pair (108).

Example 6 includes the amplifier (100) of example 1, wherein the input pair (106) is a first input pair (106) and the amplifier (100) includes a second input pair (108) coupled to the input of the folded cascode circuitry (110), a first switch having a fifth drain, a fifth source, and a fifth gate, the fifth drain coupled to the input pair (106), a second switch (152) having a sixth drain, a sixth source, and a sixth gate, the sixth drain coupled to the second input pair (108), and a digital control generator (140) having a first digital control output (Skew) and a second digital control output (SkewZ), the first digital control output (Skew) coupled to the fifth gate and the second digital control output (SkewZ) coupled to the sixth gate.

Example 7 includes the amplifier (100) of example 1, wherein the amplifier (100) further includes an output stage (114) including a fifth transistor (180) having a fifth drain, a fifth source, and a fifth gate, the fifth gate coupled to the first source and the output of the folded cascode circuitry (110), a sixth transistor (184) having a sixth drain, a sixth source, and a sixth gate, the sixth source coupled to the fifth drain, a first capacitor (188) coupled between the fifth gate and the sixth drain, a seventh transistor (178) having a seventh drain, a seventh source, and a seventh gate, the seventh gate coupled to third source, an eighth transistor (182) having an eighth drain, an eighth source, and an eighth gate, the eighth source coupled to the seventh drain and the eighth drain coupled to the sixth drain, a second capacitor (186) coupled between the seventh gate and the eighth drain, and an output stage output (OUT) located between the sixth drain and the eighth drain.

Example 8 includes the amplifier (100) of example 1, wherein the amplifier (100) further includes a current mirror (112) having a current mirror input and a current mirror output, the current mirror input coupled to the input pair (106) via a fifth transistor (192*a*) and to the input of the folded cascode circuitry (110) via the fifth transistor (192*a*), and the current mirror output coupled to third source.

Example 9 includes the amplifier (100) of example 1, wherein the amplifier (100) further includes a fifth (126) transistor having a fifth drain, a fifth source, and a fifth gate, the fifth gate coupled to the second gate and the second drain, and a current mirror (134) including a current mirror input coupled to the fifth drain, a current mirror output, and a capacitor (146) coupled to the output, a sixth transistor (128) having a sixth drain, a sixth source, and a sixth gate, the sixth gate coupled to the fourth gate and the fourth drain, a seventh transistor (130)) having a seventh drain, a seventh source, and a seventh gate, the seventh drain coupled to the sixth drain, and the seventh gate coupled to the seventh drain, and an eighth transistor (132) having an eighth drain, an eighth source, and an eighth gate, the eighth gate coupled to the seventh gate and the seventh drain, and the eighth drain coupled to the current mirror input.

Example 10 includes the amplifier (100) of example 9, wherein the amplifier (100) further includes a reference current source (148) coupled to the current mirror output, a first logic gate (136) having a first logic gate input and a first logic gate output, the first logic gate input coupled to the current mirror output and the reference current source (148), a second logic gate (138) having a second logic gate input and a second logic gate output, the second logic gate input coupled to the first logic gate output, a digital control generator (140) having a first digital control input, a second digital control input, a first digital control output (Skew), and a second digital control output (SkewZ), the first digital control input coupled to the first logic gate output, the second digital control input coupled to the second logic gate output, and a first switch (150) having ninth drain and a ninth gate, the ninth gate coupled to the first digital control (Skew) output and the ninth drain coupled to the input pair (106).

Example 11 includes an apparatus comprising first clamping circuitry (116*a*) having a first clamping input and a first clamping output, second clamping circuitry (116*b*) having a second clamping input and a second clamping output, folded cascode circuitry (110) having a first input, a second input, and a first output, the first output coupled to the first clamping input and the second clamping input, and a first input device (106) having a second output and a third output, the second output coupled to the first input and the third output coupled to the second input.

Example 12 includes the apparatus of example 11, further including a second input device (108) having a fourth output and a fifth output, the fourth output coupled to the second output and the fifth output coupled to the third output.

Example 13 includes the apparatus of example 11, further including a second input device (108) having a fourth output and a fifth output, the fourth output coupled to the second output and the fifth output coupled to the third output, a first control switch (150) coupled to the first input device (106), a second control switch (152) coupled to the second input device (108), and skew signal generation circuitry (104) having a first skew input, a second skew input, and first skew output (Skew), and a second skew output (SkewZ), the first skew input coupled to the first clamping output, the second skew input coupled to the second clamping output, the first skew output (Skew) coupled to the first control switch (150), and the second skew output (SkewZ) coupled to the second control switch (152).

Example 14 includes the apparatus of example 13, wherein the first input device (106) is a main input pair (106), the first skew output (Skew) is to activate or disengage the main input pair (106) responsive to a current flowing through the first clamping circuitry (116a) or the second clamping circuitry (116b).

Example 15 includes the apparatus of example 13, wherein the second input device (108) is an auxiliary input pair (108), the second skew output (SkewZ) is to activate or disengage the auxiliary input pair (108) responsive to a current flowing through the first clamping circuitry (116a) or the second clamping circuitry (116b).

Example 16 includes the apparatus of example 11, wherein the first clamping circuitry (116b) includes a first transistor (118) having a first drain, a first source, and a first gate, the first source coupled to the first output, and a second transistor (120) having a second drain, a second source, and a second gate, the second drain coupled to the first drain and the second gate coupled to the first drain and second drain.

Example 17 includes the apparatus of example 11, wherein the second clamping circuitry (116b) includes a first transistor (122) having a first drain, a first source, and a first gate, the first source coupled to the first output, and a second transistor (124) having a second drain, a second source, and a second gate, the second drain coupled to the first drain and the second gate coupled to the first drain and the second drain.

Example 18 includes an amplifier (100) comprising a differential input (INP, INN), folded cascode circuitry (110) having an input and an output, a first input pair of transistors (106) coupled to the input and to the differential input (INP. INN), a second pair of input transistors (108) coupled to the input and to the differential input (INP. INN), and clamp circuitry (116) including a first transistor (118) having a first current terminal, a second current terminal, and a first control terminal, the second current terminal coupled to the output, a second transistor (120) having a third current terminal, a fourth current terminal, and a second control terminal, the third current terminal coupled to the first current terminal and the second control signal coupled to the first current terminal and third current terminal, a third transistor (122) having a fifth current terminal, a sixth current terminal, and a third control terminal, the sixth current terminal coupled to the output, and a fourth transistor (124) having a seventh current terminal, an eighth current terminal, and a fourth control terminal, the seventh current terminal coupled to the fifth current terminal and the fourth control terminal coupled to the fifth current terminal and the seventh current terminal.

Example 19 includes the amplifier (100) of example 18, further including a fifth transistor (126) having a ninth current terminal, a tenth current terminal, and a fifth control terminal, the fifth control terminal coupled to the second control terminal and the third current terminal, and a current mirror (134) including a sixth transistor (142) having an eleventh current terminal and a sixth control terminal, the eleventh current terminal coupled to the ninth current terminal and to the sixth control terminal, a seventh transistor (144) having a twelfth current terminal and a seventh control terminal, the seventh control terminal coupled to the sixth control terminal, and a capacitor (146) coupled between the twelfth current terminal and the seventh control terminal.

Example 20 includes the amplifier (100) of example 18, further including a fifth transistor (128) having a ninth current terminal, a tenth current terminal, and a fifth control terminal, the fifth control terminal coupled to the fourth control terminal and the seventh current terminal, a sixth transistor (130) having an eleventh current terminal, a twelfth current terminal, and a sixth control terminal, the eleventh current terminal coupled to the ninth current terminal and the sixth control terminal coupled to the eleventh current terminal, a seventh transistor (132) having a thirteenth current terminal, a fourteenth current terminal, and a seventh control terminal, the seventh control terminal coupled to the sixth control terminal and the eleventh current terminal, and a current mirror (134) including an eighth transistor (142) having a fifteenth current terminal and an eighth control terminal, the fifteenth current terminal coupled to the thirteenth current terminal and to the eighth control terminal, a ninth transistor (144) having a sixteenth current terminal and a ninth control terminal, the ninth control terminal coupled to the eighth control terminal, and a capacitor (146) coupled between the sixteenth current terminal and the ninth control terminal.

The term "couple" is used throughout the specification. The term may cover connections, communications, or signal paths that enable a functional relationship consistent with this description. For example, if device A provides a signal to control device B to perform an action, in a first example device A is coupled to device B. or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). As used herein, the term "body connection" and/or "body terminal" means any type of connection to the substrate and/or underlying doped region (such as a back gate connection, and/or a substrate connection or buried doped region connection through a deep, doped region or through the back surface of the semiconductor die).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package: (iii) incorporated into the same module: and/or (iv) incorporated in/on the same printed circuit board Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about." "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An amplifier comprising:
   folded cascode circuitry having an input and an output;
   an input pair of transistors coupled to the input; and
   clamp circuitry including:
      a first transistor having a first drain, a first source, and a first gate, the first source coupled to the output;
      a second transistor having a second drain, a second source, and a second gate, the second drain coupled to the first drain and the second gate coupled to the first drain and second drain;
      a third transistor having a third drain, a third source, and a third gate, the third source coupled to the output; and
      a fourth transistor having a fourth drain, a fourth source, and a fourth gate, the fourth drain coupled to the third drain and the fourth gate coupled to the third drain and the fourth drain.

2. The amplifier of claim 1, wherein the amplifier further includes:
   a fifth transistor having a fifth drain, a fifth source, and a fifth gate, the fifth gate coupled to the second gate and the second drain; and
   a current mirror including:
      a current mirror input coupled to the fifth drain;
      a current mirror output; and
      a capacitor coupled to the output.

3. The amplifier of claim 1, wherein the amplifier further includes:
   a fifth transistor having a fifth drain, a fifth source, and a fifth gate, the fifth gate coupled to the fourth gate and the fourth drain;
   a sixth transistor having a sixth drain, a sixth source, and a sixth gate, the sixth drain coupled to the fifth drain and the sixth gate coupled to the sixth drain;
   a seventh transistor having a seventh drain, a seventh source, and a seventh gate, the seventh gate coupled to the sixth gate and the sixth drain;
   a current mirror including:
      a current mirror input coupled to the seventh drain;
      a current mirror output; and
      a capacitor coupled to the output.

4. The amplifier of claim 1, wherein the amplifier further includes:
   a current mirror having a current mirror input and a current mirror output;
   a reference current source coupled to the current mirror output;
   a first logic gate having a first logic gate input and a first logic gate output, the first logic gate input coupled to the current mirror output and the reference current source;
   a second logic gate having a second logic gate input and a second logic gate output, the second logic gate input coupled to the first logic gate output;
   a digital control generator having a first digital control input, a second digital control input, a first digital control output, and a second digital control output, the first digital control input coupled to the first logic gate output, the second digital control input coupled to the second logic gate output; and a first switch having first switch input and a first switch output, the first switch input coupled to the first digital control output and the first switch output coupled to the input pair of transistors.

5. The amplifier of claim 1, wherein the input pair of transistors is a first input pair of transistors and the amplifier includes:
a second input pair of transistors coupled to the input; and
a first switch having a first switch input and a first switch output, the first switch output coupled to the second input pair of transistors.

6. The amplifier of claim 1, wherein the input pair of transistors is a first input pair of transistors and the amplifier includes:
a second input pair of transistors coupled to the input of the folded cascode circuitry;
a first switch having a fifth drain, a fifth source, and a fifth gate, the fifth drain coupled to the first input pair of transistors;
a second switch having a sixth drain, a sixth source, and a sixth gate, the sixth drain coupled to the second input pair of transistors; and
a digital control generator having a first digital control output and a second digital control output, the first digital control output coupled to the fifth gate and the second digital control output coupled to the sixth gate.

7. The amplifier of claim 1, wherein the amplifier further includes an output stage including:
a fifth transistor having a fifth drain, a fifth source, and a fifth gate, the fifth gate coupled to the first source and the output of the folded cascode circuitry;
a sixth transistor having a sixth drain, a sixth source, and a sixth gate, the sixth source coupled to the fifth drain;
a first capacitor coupled between the fifth gate and the sixth drain;
a seventh transistor having a seventh drain, a seventh source, and a seventh gate, the seventh gate coupled to third source;
an eighth transistor having an eighth drain, an eighth source, and an eighth gate, the eighth source coupled to the seventh drain and the eighth drain coupled to the sixth drain;
a second capacitor coupled between the seventh gate and the eighth drain; and
an output stage output located between the sixth drain and the eighth drain.

8. The amplifier of claim 1, wherein the amplifier further includes a current mirror having a current mirror input and a current mirror output, the current mirror input coupled to the input pair of transistors and to the input of the folded cascode circuitry and the current mirror output coupled to third source.

9. The amplifier of claim 1, wherein the amplifier further includes:
a fifth transistor having a fifth drain, a fifth source, and a fifth gate, the fifth gate coupled to the second gate and the second drain; and
a current mirror including:
a current mirror input coupled to the fifth drain;
a current mirror output; and
a capacitor coupled to the output;
a sixth transistor having a sixth drain, a sixth source, and a sixth gate, the sixth gate coupled to the fourth gate and the fourth drain;

a seventh transistor having a seventh drain, a seventh source, and a seventh gate, the seventh drain coupled to the sixth drain, and the seventh gate coupled to the seventh drain; and
an eighth transistor having an eighth drain, an eighth source, and an eighth gate, the eighth gate coupled to the seventh gate and the seventh drain, and the eighth drain coupled to the current mirror input.

10. The amplifier of claim 9, wherein the amplifier further includes:
a reference current source coupled to the current mirror output;
a first logic gate having a first logic gate input and a first logic gate output, the first logic gate input coupled to the current mirror output and the reference current source;
a second logic gate having a second logic gate input and a second logic gate output, the second logic gate input coupled to the first logic gate output;
a digital control generator having a first digital control input, a second digital control input, a first digital control output, and a second digital control output, the first digital control input coupled to the first logic gate output, the second digital control input coupled to the second logic gate output; and
a first switch having ninth drain and a ninth gate, the ninth gate coupled to the first digital control output and the ninth drain coupled to the input pair of transistors.

11. An apparatus comprising:
first clamping circuitry having a first clamping input and a first clamping output;
second clamping circuitry having a second clamping input and a second clamping output;
folded cascode circuitry having a first input, a second input, and a first output, the first output coupled to the first clamping input and the second clamping input;
a first input device having a second output and a third output, the second output coupled to the first input and the third output coupled to the second input; and
a second input device having a fourth output and a fifth output, the fourth output coupled to the second output and the fifth output coupled to the third output.

12. The apparatus of claim 11, further including:
a first control switch coupled to the first input device;
a second control switch coupled to the second input device; and
skew signal generation circuitry having a first skew input, a second skew input, and first skew output, and a second skew output, the first skew input coupled to the first clamping output, the second skew input coupled to the second clamping output, the first skew output coupled to the first control switch, and the second skew output coupled to the second control switch.

13. The apparatus of claim 12, wherein the first input device is a main input pair of transistors, the first skew output is to activate or disengage the main input pair of transistors responsive to a current flowing through the first clamping circuitry or the second clamping circuitry.

14. The apparatus of claim 12, wherein the second input device is an auxiliary input pair of transistors, the second skew output is to activate or disengage the auxiliary input pair of transistors responsive to a current flowing through the first clamping circuitry or the second clamping circuitry.

15. The apparatus of claim 11, wherein the second clamping circuitry includes:
a first transistor having a first drain, a first source, and a first gate, the first source coupled to the first output; and a second transistor having a second drain, a second source, and a second gate, the second drain coupled to the first drain and the second gate coupled to the first drain and the second drain.

16. An apparatus comprising:
first clamping circuitry having a first clamping input and a first clamping output;
second clamping circuitry having a second clamping input and a second clamping output;
folded cascode circuitry having a first input, a second input, and a first output, the first output coupled to the first clamping input and the second clamping input; and
a first input device having a second output and a third output, the second output coupled to the first input and the third output coupled to the second input; and
wherein the first clamping circuitry including:
a first transistor having a first drain, a first source, and a first gate, the first source coupled to the first output; and
a second transistor having a second drain, a second source, and a second gate, the second drain coupled to the first drain and the second gate coupled to the first drain and second drain.

17. An amplifier comprising:
folded cascode circuitry having an input and an output;
a first pair of input transistors coupled to the input;
a second pair of input transistors coupled to the input; and
clamp circuitry including:
  a first transistor having a first current terminal, a second current terminal, and a first control terminal, the second current terminal coupled to the output;
  a second transistor having a third current terminal, a fourth current terminal, and a second control terminal, the third current terminal coupled to the first current terminal and the second control terminal coupled to the first current terminal and third current terminal;
  a third transistor having a fifth current terminal, a sixth current terminal, and a third control terminal, the fifth current terminal coupled to the output; and
  a fourth transistor having a seventh current terminal, an eighth current terminal, and a fourth control terminal, the seventh current terminal coupled to the fifth current terminal and the fourth control terminal coupled to the fifth current terminal and the seventh current terminal.

18. The amplifier of claim 17, further including:
a fifth transistor having a ninth current terminal, a tenth current terminal, and a fifth control terminal, the fifth control terminal coupled to the second control terminal and the third current terminal; and
a current mirror including:
  a sixth transistor having an eleventh current terminal and a sixth control terminal, the eleventh current terminal coupled to the ninth current terminal and to the sixth control terminal;
  a seventh transistor having a twelfth current terminal and a seventh control terminal, the seventh control terminal coupled to the sixth control terminal; and
  a capacitor coupled between the twelfth current terminal and the seventh control terminal.

19. The amplifier of claim 17, further including:
a fifth transistor having a ninth current terminal, a tenth current terminal, and a fifth control terminal, the fifth control terminal coupled to the fourth control terminal and the seventh current terminal;
a sixth transistor having an eleventh current terminal, a twelfth current terminal, and a sixth control terminal, the eleventh current terminal coupled to the ninth current terminal and the sixth control terminal coupled to the eleventh current terminal;
a seventh transistor having a thirteenth current terminal, a fourteenth current terminal, and a seventh control terminal, the seventh control terminal coupled to the sixth control terminal and the eleventh current terminal;
a current mirror including:
  an eighth transistor having a fifteenth current terminal and an eighth control terminal, the fifteenth current terminal coupled to the thirteenth current terminal and to the eighth control terminal;
  a ninth transistor having a sixteenth current terminal and a ninth control terminal, the ninth control terminal coupled to the eighth control terminal; and
  a capacitor coupled between the sixteenth current terminal and the ninth control terminal.

* * * * *